United States Patent
Yan et al.

(10) Patent No.: US 12,405,536 B2
(45) Date of Patent: Sep. 2, 2025

(54) METHOD FOR OPTIMIZING LIGHT SOURCE IN INTEGRATED CIRCUIT MANUFACTURING AND ELECTRONIC DEVICE

(71) Applicant: SHENZHEN JINGYUAN INFORMATION TECHNOLOGY CO., LTD, Shenzhen (CN)

(72) Inventors: Ge Yan, Shenzhen (CN); Ming Ding, Shenzhen (CN)

(73) Assignee: SHENZHEN JINGYUAN INFORMATION TECHNOLOGY CO., LTD, Shenzhen (CN)

( * ) Notice: Subject to any disclaimer, the term of this patent is extended or adjusted under 35 U.S.C. 154(b) by 164 days.

(21) Appl. No.: 18/320,223

(22) Filed: May 19, 2023

(65) Prior Publication Data
US 2023/0288816 A1  Sep. 14, 2023

Related U.S. Application Data

(63) Continuation of application No. PCT/CN2020/132974, filed on Nov. 30, 2020.

(30) Foreign Application Priority Data

Nov. 20, 2020 (CN) .......................... 202011314971.5

(51) Int. Cl.
G03F 7/00 (2006.01)
(52) U.S. Cl.
CPC ........ *G03F 7/7055* (2013.01); *G03F 7/70125* (2013.01); *G03F 7/70504* (2023.05); *G03F 7/70508* (2013.01)

(58) Field of Classification Search
CPC .............. G03F 7/7055; G03F 7/70504; G03F 7/70508; G03F 7/705; G03F 1/36;
(Continued)

(56) References Cited

U.S. PATENT DOCUMENTS

| 7,217,503 B2 * | 5/2007 | Saitoh ....................... G03F 1/30 430/394 |
| 2006/0126046 A1 * | 6/2006 | Hansen ............... G03F 7/70108 355/55 |

(Continued)

FOREIGN PATENT DOCUMENTS

CN 109143796 A 1/2019

*Primary Examiner* — Christina A Riddle
(74) *Attorney, Agent, or Firm* — Andrew C. Cheng

(57) ABSTRACT

The method for optimizing a light source in integrated circuit manufacturing, includes following steps: S1, providing an initial light source; S2, performing region segmentation according to light intensity distribution of the initial light source to obtain a plurality of sub light source regions; S3, providing at least two matching patterns and matching them with each sub light source region to obtain at least two matching results corresponding to each sub light source region; S4, performing calculating based on the at least two matching results and each sub light source region to obtain a best matching pattern corresponding to each sub light source region; and S5, generating a light source to be optimized based on the best matching pattern corresponding to each sub light source region.

9 Claims, 13 Drawing Sheets

(58) Field of Classification Search
CPC ..... G03F 7/20; G03F 1/68; G03F 1/70; G03F 1/84; G03F 7/70433; G03F 7/70525; G03F 7/70625; G03F 7/7065; G03F 7/70; G03F 7/70075–70125; G03F 7/70141; G03F 7/7015–70191; G03F 7/70483–70541; G03F 7/70558; G03F 7/70591; G03F 7/706; G06F 30/398; G01N 21/956
USPC .......... 355/18, 30, 52–55, 67–77; 716/50–56
See application file for complete search history.

(56) References Cited

U.S. PATENT DOCUMENTS

| | | | |
|---|---|---|---|
| 2010/0053580 A1* | 3/2010 | Sekine | G03F 7/70666 355/53 |
| 2010/0180252 A1* | 7/2010 | Kawashima | G03F 7/70433 716/55 |
| 2011/0058729 A1 | 3/2011 | Inoue et al. | |
| 2011/0107277 A1* | 5/2011 | Tsujita | G03F 7/70125 716/50 |
| 2012/0054697 A1* | 3/2012 | Takahata | G03F 7/70125 716/55 |
| 2014/0068530 A1* | 3/2014 | Chen | G03F 7/705 716/54 |
| 2014/0233008 A1* | 8/2014 | Tanitsu | G02B 27/286 355/71 |
| 2023/0126600 A1* | 4/2023 | Tobioka | H10B 43/27 257/314 |

\* cited by examiner

METHOD FOR OPTIMIZING LIGHT SOURCE IN INTEGRATED CIRCUIT MANUFACTURING AND ELECTRONIC DEVICE

CROSS-REFERENCE TO RELATED APPLICATIONS

This application claims priority to Chinese Patent Application No. 202011314971.5, disclosure of which is hereby incorporated by reference in its entireties.

TECHNICAL FIELD

The present disclosure is related to an integrated circuit manufacturing technological field, and especially related to a method for optimizing a light source in integrated circuit manufacturing and an electronic device.

BACKGROUND OF THE INVENTION

Lithography technology is one of key technologies for large-scale integrated circuit manufacturing. When an exposure wavelength and a numerical aperture of a lithography machine are fixed, resolution enhancement technology needs to be used to reduce process factors and improve lithography resolution. Light source optimization technology is an important resolution enhancement technology, which has greater freedom compared to traditional resolution enhancement technologies such as optical proximity correction technologies, and has advantages of low cost and fast implementation speed. It is a key technology for further improving lithography resolution and process window.

At present, light source optimization methods under study include the light source mask optimization method based on a genetic algorithm, the light source optimization algorithm based on particle swarm optimization, the light source optimization method based on linear programming, and so on. However, due to limitations in actual production technology, sometimes intensity of light sources optimized through some algorithm simulations cannot be concentrated enough to achieve a desired optimization effect and to obtain a desired shape of the light source. Currently, there is no existing algorithm that can actually solve these problems.

SUMMARY OF THE INVENTION

To overcome the technical problem of uneven distribution of light sources in existing light source optimization methods, the present disclosure provides a method for optimizing light sources in integrated circuit manufacturing and an electronic device.

In order to solve above-mentioned technological problems, the present disclosure provides a technical solution: a method for optimizing light sources in integrated circuit manufacturing, includes following steps: S1, providing an initial light source; S2, performing region segmentation according to light intensity distribution of the initial light source to obtain a plurality of sub light source regions; S3, providing at least two matching patterns and matching them with each sub light source region to obtain at least two matching results corresponding to each sub light source region; S4, performing calculating based on the at least two matching results and each sub light source region to obtain a best matching pattern corresponding to each sub light source region; and S5, generating a light source to be optimized based on the best matching pattern corresponding to each sub light source region.

Preferably, the method further includes the following step: S6, optimizing the light source to be optimized using an optimizing algorithm for optimizing light source.

Preferably, the method further includes the following step: S20, pixelating the initial light source, setting a light source intensity threshold, removing light source pixels below the light source intensity threshold and removing isolated light source pixels; step S20 is between step S1 and step S2.

Preferably, the method further includes the following step: S20, pixelating the initial light source, setting a light source intensity threshold, removing light source pixels below the light source intensity threshold and removing isolated light source pixels; wherein, the step S20 is between step S1 and step S2.

Preferably, in step S3, the at least two matching results include shape parameters corresponding to each matching pattern.

Preferably, step S4 includes the following steps: S41, generating a corresponding shape based on the shape parameters of each matching pattern and filling the corresponding shape with a light source intensity; and S42, performing calculation based on the shape parameters and the light source intensity in step S41 and the initial light source to obtain matching parameters, and determining a best matching pattern based on the matching parameters.

Preferably, in step S42, the performing calculation is based on normalization, and a formula for calculating the matching parameter $R_{ccoeff\_normed}$ is as follows:

$$R_{ccoeff\_normed} = \frac{\sum_{x',y'} T'(x', y') \cdot I'(x', y')}{\sqrt{\sum_{x',y'} T'(x', y')^2 \cdot \sum_{x',y'} I'(x', y')^2}}$$

Wherein, T'(x', y') is light source intensity of the initial light source at a point (x', y'); I'(x', y') is light source intensity of a matching pattern corresponding to each matching result at the point (x', y').

Preferably, in step S5, the best matching pattern corresponding to each sub light source region is joined together in order to obtain the light source to be optimized.

Preferably, in step S3, the at least two matching patterns include regular polygons or irregular polygons, wherein the regular polygons include one or more shapes of a circle, a rectangle, and a sector, and the irregular polygons include one or more shapes of a leaf shape, a "zigzag" shape, and a "N" shape.

Preferably, in step S2, a rule for region segmentation is: grouping light source pixels with light source intensity values in 8 pixel positions around each pixel into a same group.

In order to solve above-mentioned technological problems, the present disclosure further provides an electronic device, which includes one or more processors, a storage device configured to storing one or more programs, when the one or more programs is executed by the one or more processors, the one or more processors are caused to perform the method.

Comparing with existing technologies, the method for optimizing light sources in integrated circuit manufacturing and the electronic device provided by present disclosure has following advantages: including following steps: S1, providing an initial light source; S2, performing region segmentation according to light intensity distribution of the initial light source to obtain a plurality of sub light source regions; S3, providing at least two matching patterns and matching them with each sub light source region to obtain at least two matching results corresponding to each sub light source region; S4, performing calculating based on the at least two matching results and each sub light source region to obtain a best matching pattern corresponding to each sub light source region; and S5, generating a light source to be optimized based on the best matching pattern corresponding to each sub light source region. The at least two matching patterns are used to be matched with each sub light source region to obtain at least two matching results corresponding to each sub light source region; and based on the at least two matching results and each sub light source region, calculating is performed to obtain a best matching pattern corresponding to each sub light source region. The matching patterns provided in the present disclosure has characteristics of concentrated light source intensity distribution and ideal light source shape. Matching the matching patterns with segmented sub light source regions can effectively improve light source intensity concentration ratio of the light source to be optimized, and make a shape of the light source more ideal, Better obtain light sources that meet user needs and improve quality of light sources.

The method for optimizing a light source in integrated circuit manufacturing further includes the following step:

S20, pixelating the initial light source, setting a light source intensity threshold, removing light source pixels below the light source intensity threshold and removing isolated light source pixels, which can effectively further improve light source intensity concentration ratio of the light source, better obtain effective light source regions to be optimized, thus improving efficiency of optimizing of the light source and improving light source intensity concentration ratio of the light source.

The electronic device provided by the present disclosure has same technological effects with the method.

DETAILED DESCRIPTION OF THE INVENTION

In order to make the objects, technical solutions and advantages of the invention clearer, the invention will be further described in detail in combination with the drawings and the embodiments. It should be understood that the embodiments described herein are only used to explain the invention and are not used to limit the invention.

Figure 1:
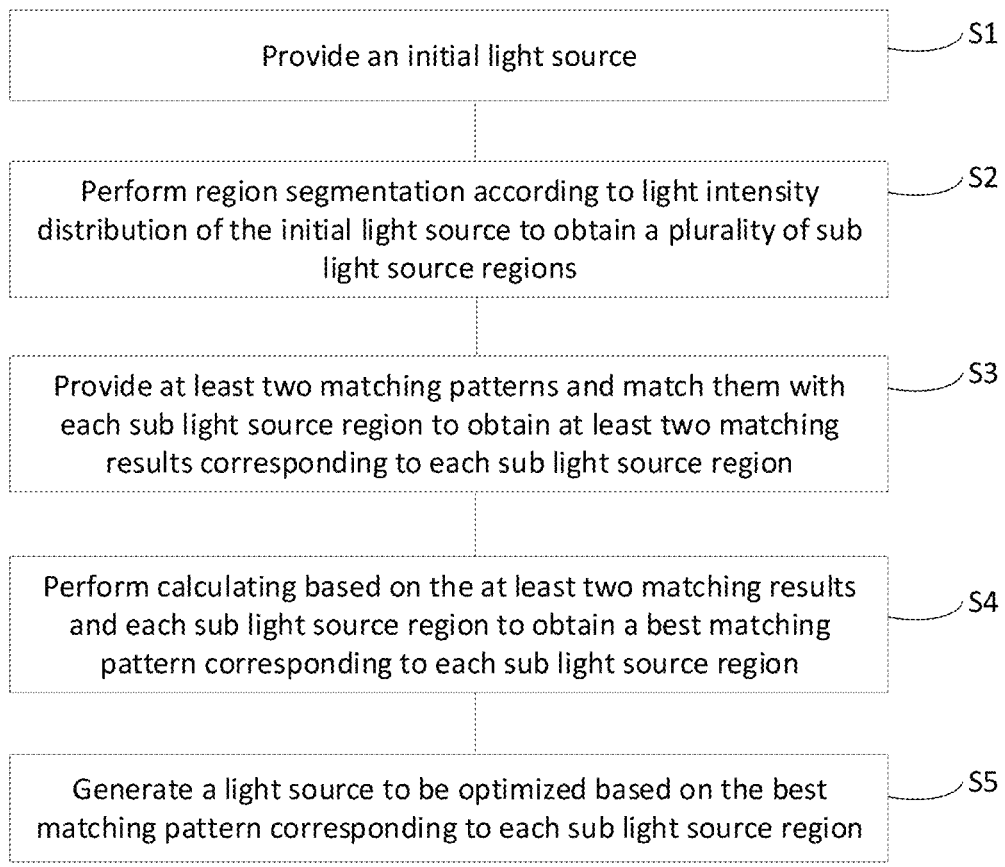
FIG. 1 is a flow chart of a method for optimizing a light source in integrated circuit manufacturing according to a first embodiment of the present disclosure.

Referring to FIG. 1, a first embodiment of the present disclosure provides a method for optimizing light sources in integrated circuit manufacturing, the method includes following steps:

S1, provide an initial light source;

S2, perform region segmentation according to light intensity distribution of the initial light source to obtain a plurality of sub light source regions;

S3, provide at least two matching patterns and match them with each sub light source region to obtain at least two matching results corresponding to each sub light source region;

S4, perform calculation based on the at least two matching results and each sub light source region to obtain best matching pattern corresponding to each sub light source region;

S5, generate a light source to be optimized based on the best matching pattern corresponding to each sub light source region.

Figure 2:
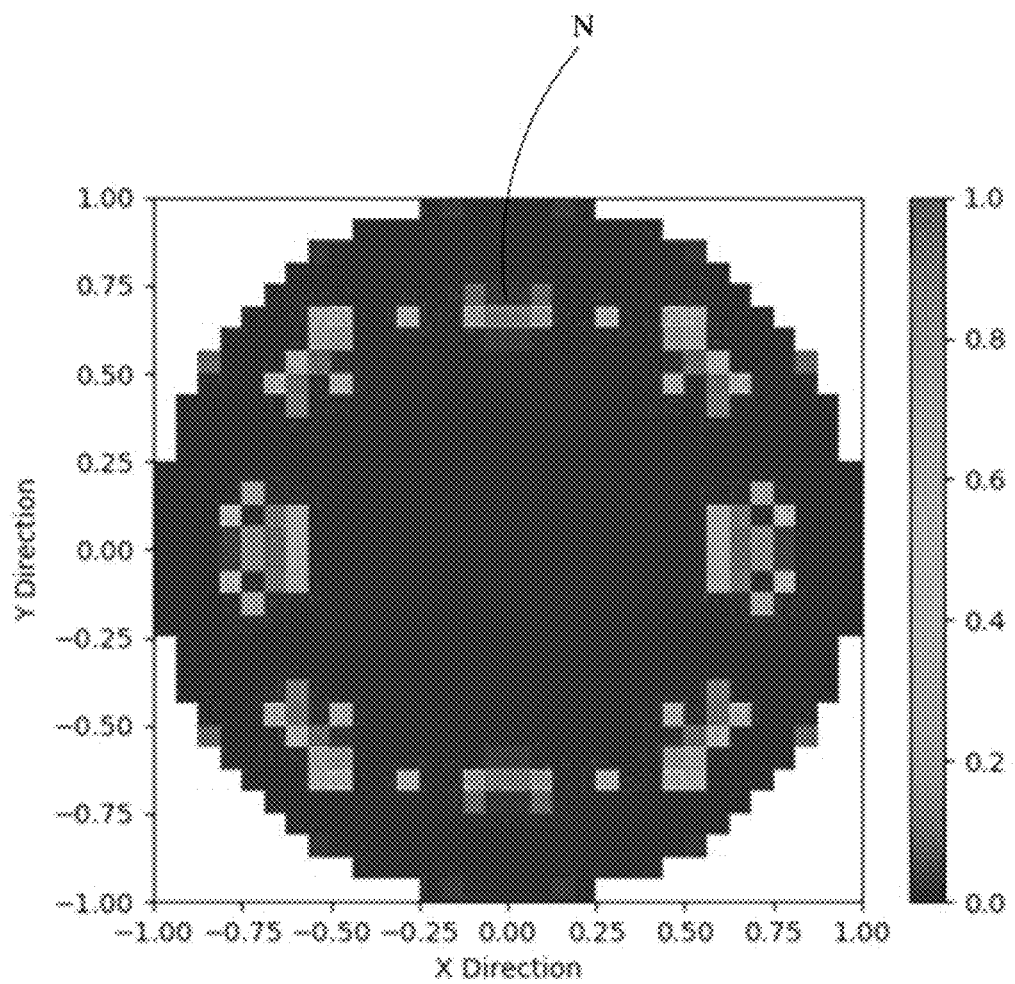
FIG. 2 is a schematic view of initial light sources in the method for optimizing a light source in integrated circuit manufacturing according to a first embodiment of the present disclosure.

Referring to FIG. 2, the initial light source may be a light source that has not been optimized by any optimization method, or a light source that has been preliminarily optimized by a traditional light source optimization method. As shown in FIG. 2, the horizontal axis of the coordinates on this diagram is the X coordinate, and the vertical axis is the Y coordinate. The color on each of coordinate positions corresponds to the color value bar pattern on the right. On the right it is a color map of the light source intensity value.

Figure 3:
FIG. 3 is a schematic view of a region N shown in FIG. 2.
Figure 3:
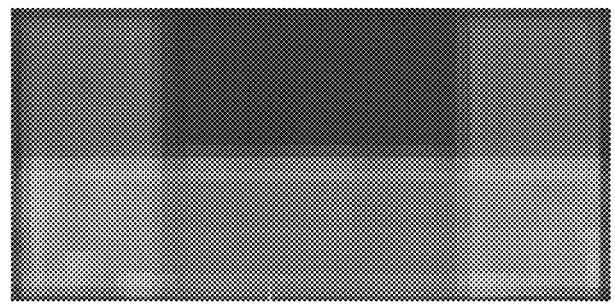

The redder the color, the stronger the intensity, and the bluer the color, the lower the intensity. For convenience of describing the steps, the coordinate axis and intensity color map will no longer be displayed in following figures, which is the same as FIG. 2. It should be noted that due to inability of black and white drawings to accurately display a depth of colors and visually represent the intensity value of the light source, FIG. 2 is only an example and cannot actually represent the actual intensity value of the initial light source. In black and white views shown in the figures of the present disclosure, black represents an intensity value of the light source as 0, while colors that are lighter than black represent that the intensity value of the light source is greater than 0. In order to better illustrate the light source intensity value in FIG. 2, a small region N in FIG. 2 is taken out for labeling the light source intensity value, as shown in FIG. 3, which corresponds to the schematic view of the region N. The light source intensity values are as follows: from the first row to the second row, and each row from left to right is as follows:

0.08, 0.00, 0.00, 0.08;
0.90, 0.95, 0.95, 0.90.

The traditional light source optimization methods are available, including light source mask optimization method based on genetic algorithm, light source optimization algorithm based on particle swarm optimization, light source optimization method based on linear programming, and etc.

Figure 4:
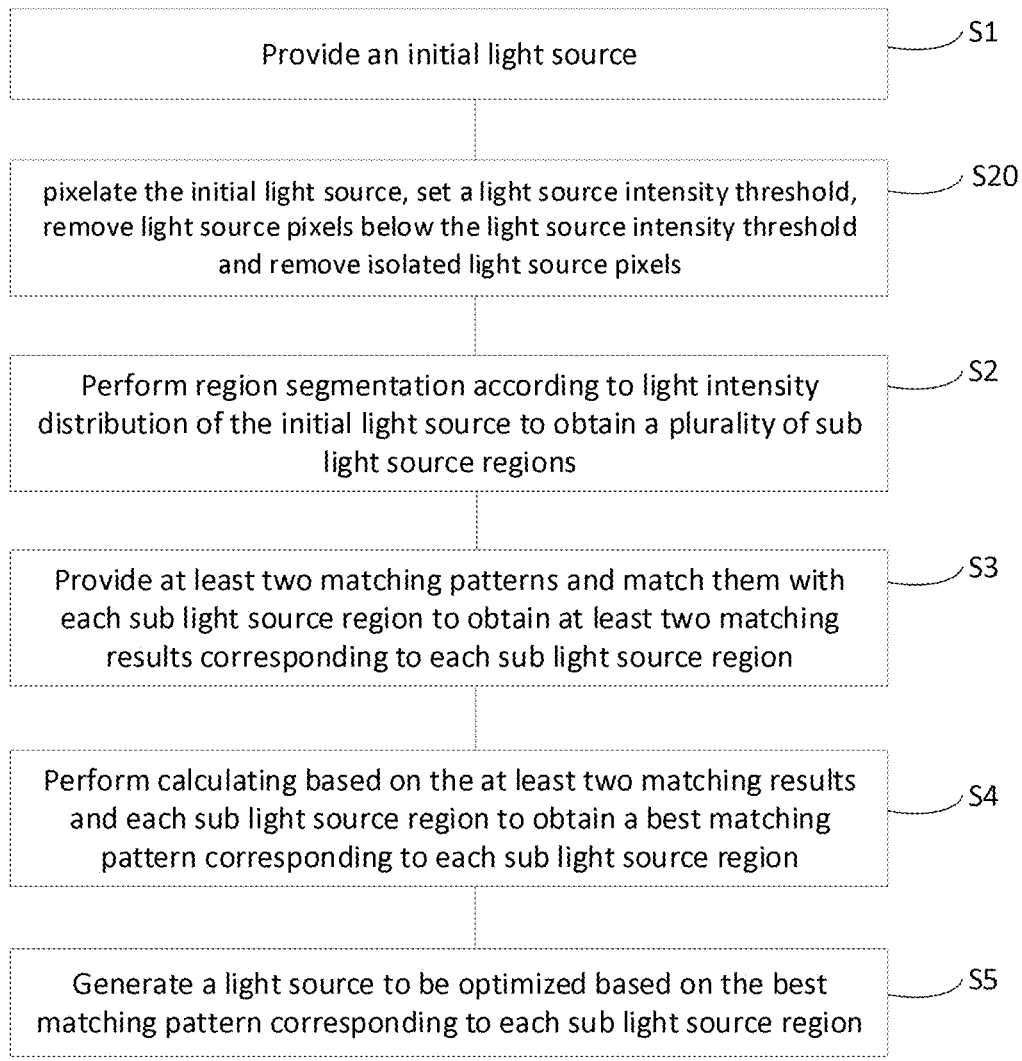
FIG. 4 is a flow chart of a method for optimizing a light source in integrated circuit manufacturing according to a variation of the first embodiment of the present disclosure.

Referring to FIG. 4, the method for optimizing light source further includes following steps:

S20, pixelate the initial light source, set a light source intensity threshold, and remove light source pixels below the light source intensity threshold, while removing isolated light source pixels; The step S20 is between the steps S1 and S2.

Figure 5:
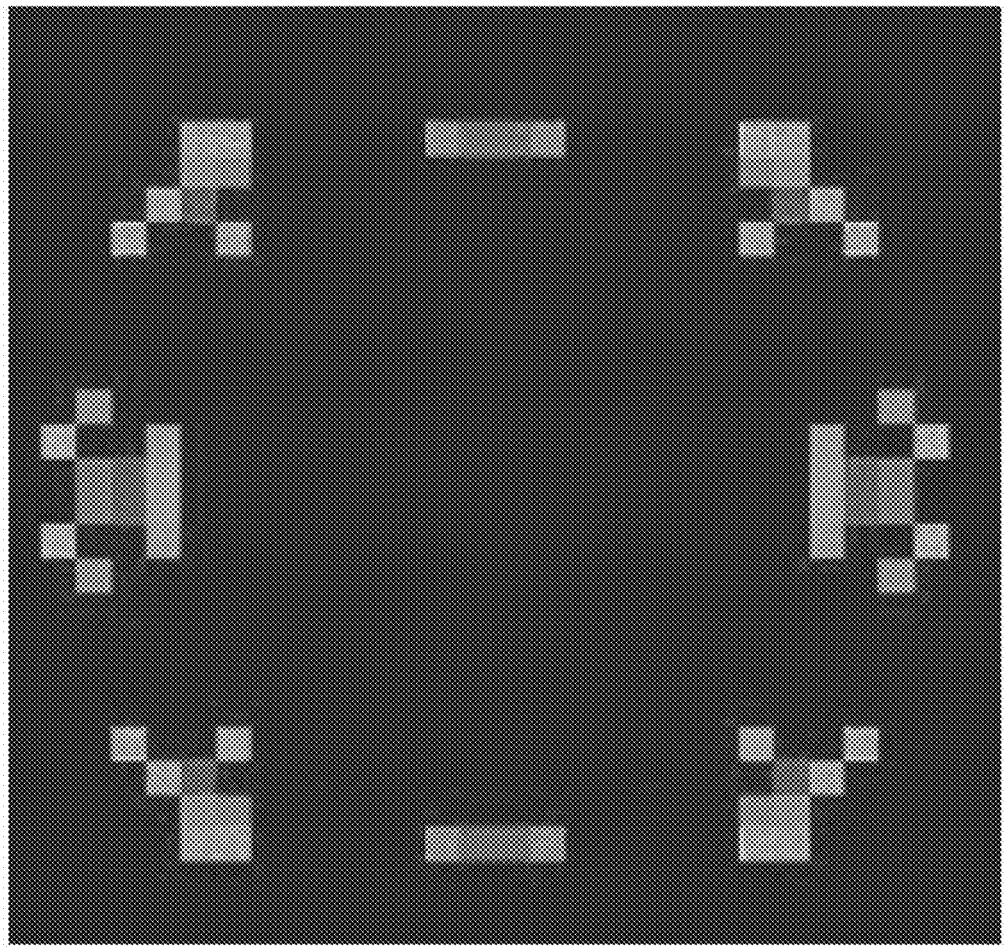
FIG. 5 is a schematic view of light source distribution after step S20 in the method for optimizing a light source in integrated circuit manufacturing according to the variation of the first embodiment of the present disclosure.

In step S20, removing light source pixels below the light source intensity threshold and isolated light source pixels can effectively improve concentration of the light source, so as to better obtain a suitable light source during the light source optimization process. The specific light source intensity threshold can be set according to user needs, such as values of 0.1, 0.2, 0.3, etc. As shown in FIG. 5, the light source intensity threshold is 0.1, and a schematic diagram of the light source after removing isolated light source pixels is illustrated.

In step S2, region segmentation is performed according to the light source intensity distribution of the initial light source to obtain a plurality of sub light source regions.

Figure 6:
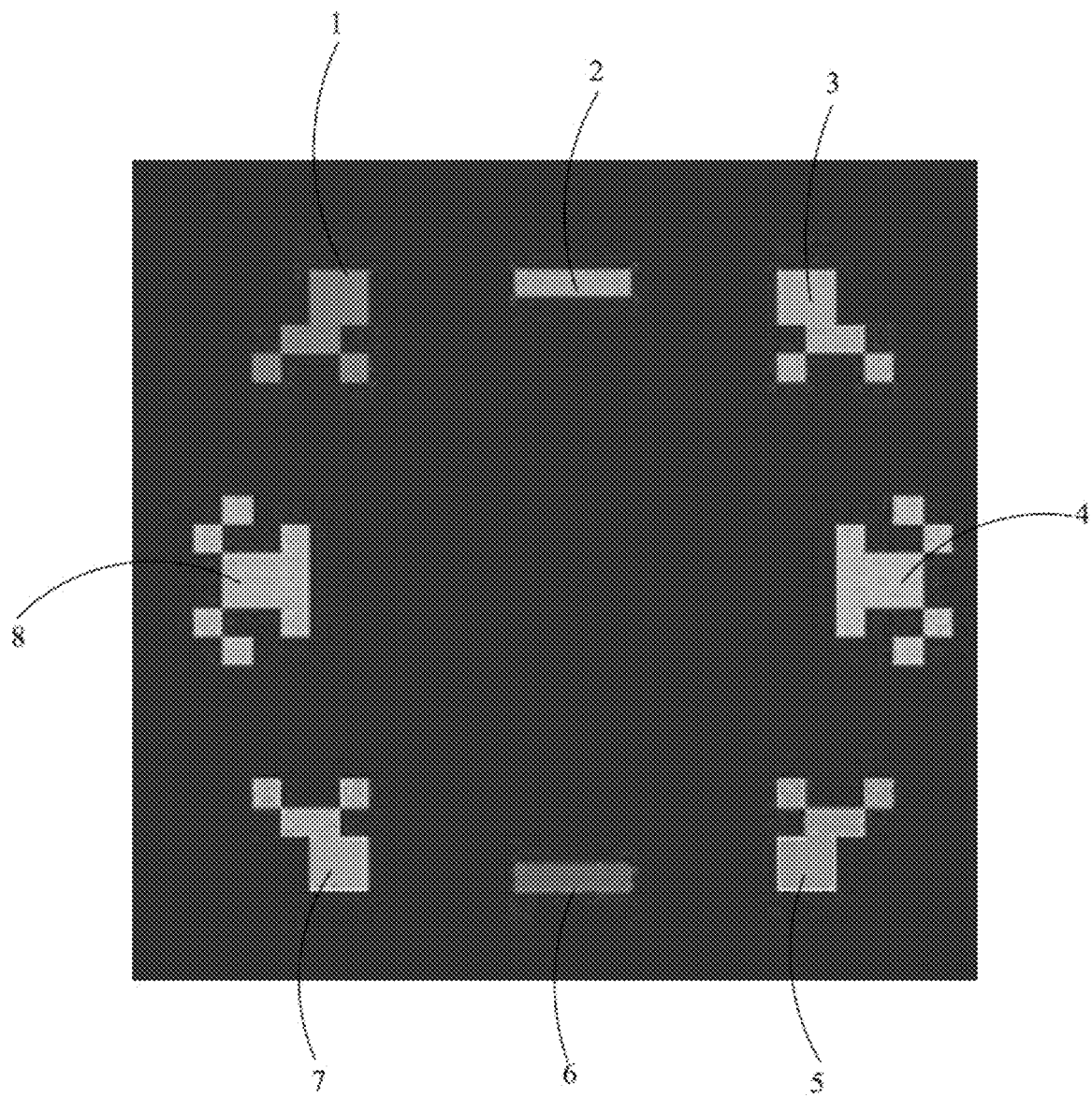
FIG. 6 is a schematic view of dividing the light source distribution into 8 regions after the step S20 in the method for optimizing a light source in integrated circuit manufacturing according to the variation of the first embodiment of the present disclosure.

Referring to FIG. 6, in the step, detailed algorithm for region segmentation is: The specific region segmentation rule is: grouping light source pixels with light source intensity values in 8 pixel positions around each pixel into a same group. Specifically, the 8 pixel positions include top, bottom, left, right, top left, bottom left, bottom right and top right. As an example, the initial light source is divided into eight sub light source regions, specifically region 1, region 2, region 3, region 4, region 5, region 6, region 7 and region 8, corresponding to labels 1, 2, 3, 4, 5, 6, 7, 8 in FIG. 6.

After the initial light source is divided into sub light source regions, the pixels in each sub light source area can be unified in pixel values, or the original light source intensity values can be retained.

In Step S3, at least two matching patterns are provided to match with each sub light source region to obtain at least two matching results corresponding to each light source region. The at least two matching patterns include regular polygons or irregular polygons. The regular polygons include one or more shapes of a circle, a rectangle, and a sector, and irregular polygons include one or more shapes of a leaf shape, a "zigzag" shape, and a "N" shape.

The at least two matching results include shape parameters corresponding to each matching pattern. For example, the shape parameters of a sector include an inner radius r1, an outer radius r2, an angle a1, and an angle a2, where the inner radius and the outer radius are calculated using the (0,0) coordinate point as the center of the circle; The shape parameters corresponding to a rectangle include a bottom left horizontal coordinate x1, a bottom left vertical coordinate y1, a top right horizontal coordinate x2, a top right vertical coordinate y2, a top left horizontal coordinate x3, a top left vertical coordinate y3, a bottom right horizontal coordinate x4, and a bottom right vertical coordinate y4. The shape parameters of a circle include a center coordinate (x, y) and a radius r.

Figure 6A:
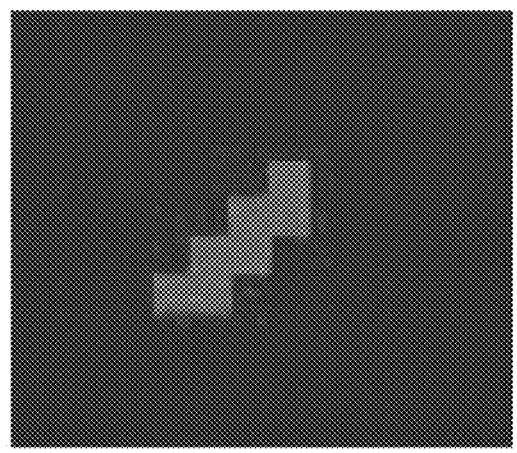
FIG. 6A is a schematic view of a shape obtained by using a sector to match a first region, regenerating a pattern based on shape parameters, and then filling regenerated pattern with light source intensity according to the first embodiment of the present disclosure.
Figure 6B:
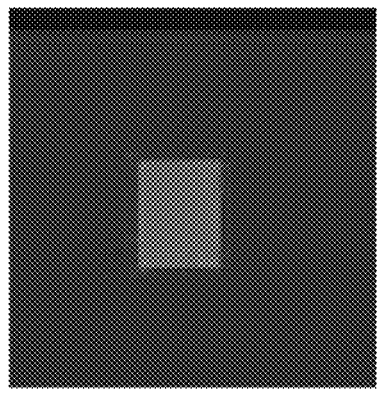
FIG. 6B is a schematic view of a shape obtained by using a rectangle to match a first region, regenerating a pattern based on shape parameters, and then filling regenerated pattern with light source intensity according to the first embodiment of the present disclosure.
Figure 6C:
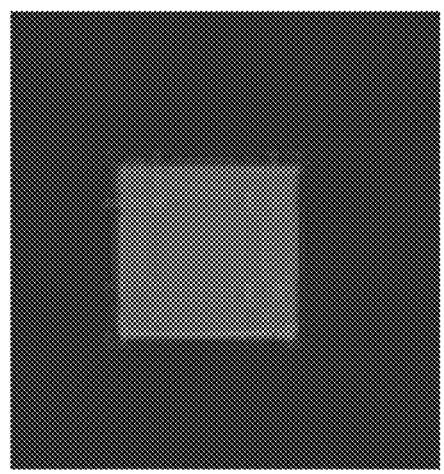
FIG. 6C is a schematic view of a shape obtained by using a circle to match a first region, regenerating a pattern based on shape parameters, and then filling regenerated pattern with light source intensity according to the first embodiment of the present disclosure.

Referring to FIGS. 6A, 6B and 6C, a sector, a rectangle and a circle are respectively used to match with the region 1 to obtain shape parameters, and then a corresponding pattern is regenerate based on the shape parameters and is assigned with a light source intensity of 1. It should be noted that, the shape in FIG. 6A is different from a sector shape due to a low resolution. If the resolution is increased, a right sector shape will be obtained. Similarly, the circle in FIG. 6C is shown in a substantial square shape due to a low resolution.

In step S4, perform calculation based on the at least two matching results and each sub light source region to obtain a best matching pattern corresponding to each sub light source region.

The at least two matching results are shape parameters corresponding to each matching pattern.

Figure 7:
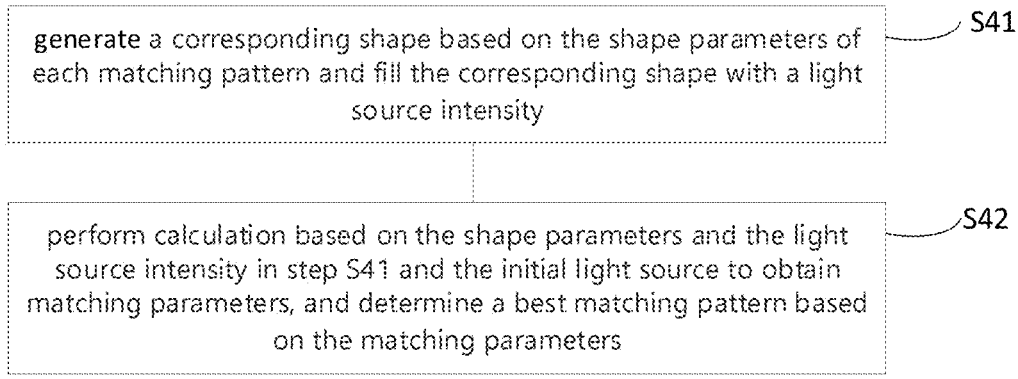
FIG. 7 is a flow chart of step S4 in the method for optimizing a light source in integrated circuit manufacturing according to a first embodiment of the present disclosure.

Referring to FIG. 7, the step S4 includes following steps:

S41, generating a corresponding shape based on the shape parameters and filling the corresponding shape with a light source intensity.

S42, performing calculation based on the shape parameters and the light source intensity in step S41 and the initial light source to obtain matching parameters, and determining a best matching pattern based on the matching parameters.

In step S41, the light source intensity filled in each shape can be the same. Alternatively, the light source intensity filled in each shape can be different value according to specific filling rules.

In step 542, there can be many methods for calculating and matching, here is not limited. The following provides a matching calculation method based on normalization, and the formula for calculating matching parameter $R_{ccoef\_f\_normed}$ is as follows:

$$R_{ccoeff\_normed} = \frac{\sum_{x',y'} T'(x', y') \cdot I'(x', y')}{\sqrt{\sum_{x',y'} T'(x', y')^2 \cdot \sum_{x',y'} I'(x', y')^2}}$$

Wherein, T'(x', y') is light source intensity of the initial light source at a point (x', y'); I'(x', y') is light source intensity of a matching pattern corresponding to each matching result at the point (x', y').

A matching parameter corresponding to each matching pattern can be obtained after the calculating and the matching patter corresponding to the greatest matching parameter is determined as the best matching pattern.

Figure 8A:
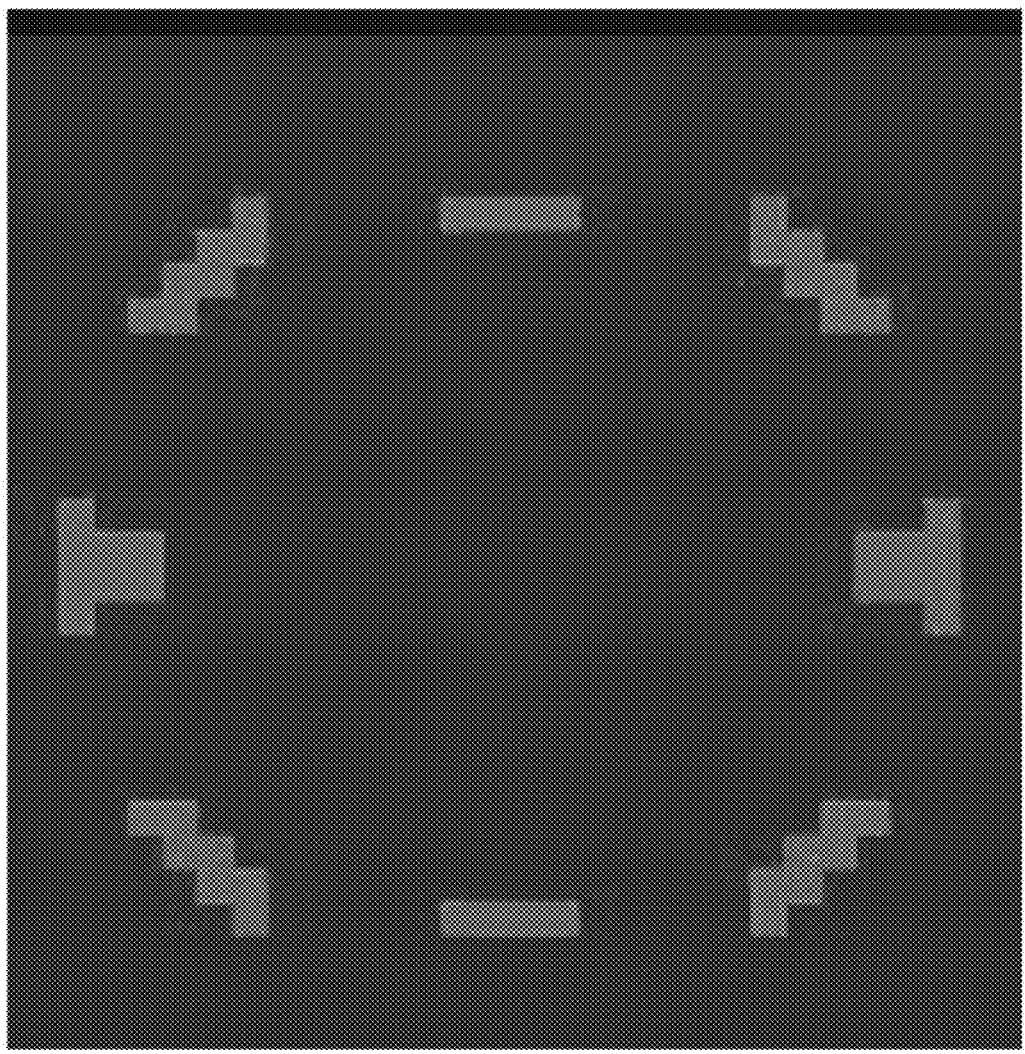
FIG. 8A is a schematic view of the light sources to be optimized in the method for optimizing a light source in integrated circuit manufacturing according to a first embodiment of the present disclosure.

Referring to FIG. 8A, after a best matching pattern for each sub light source region is obtained, in Step S5, a light source to be optimized is generated based on the best matching pattern corresponding to each sub light source region. That is, the best matching pattern of each sub light source region is joined together in order to obtain the light source to be optimized. The image shown in FIG. 8A has the same resolution as the image of the initial light source, with a spacing of 0.625 between adjacent two coordinate points.

Figure 8B:
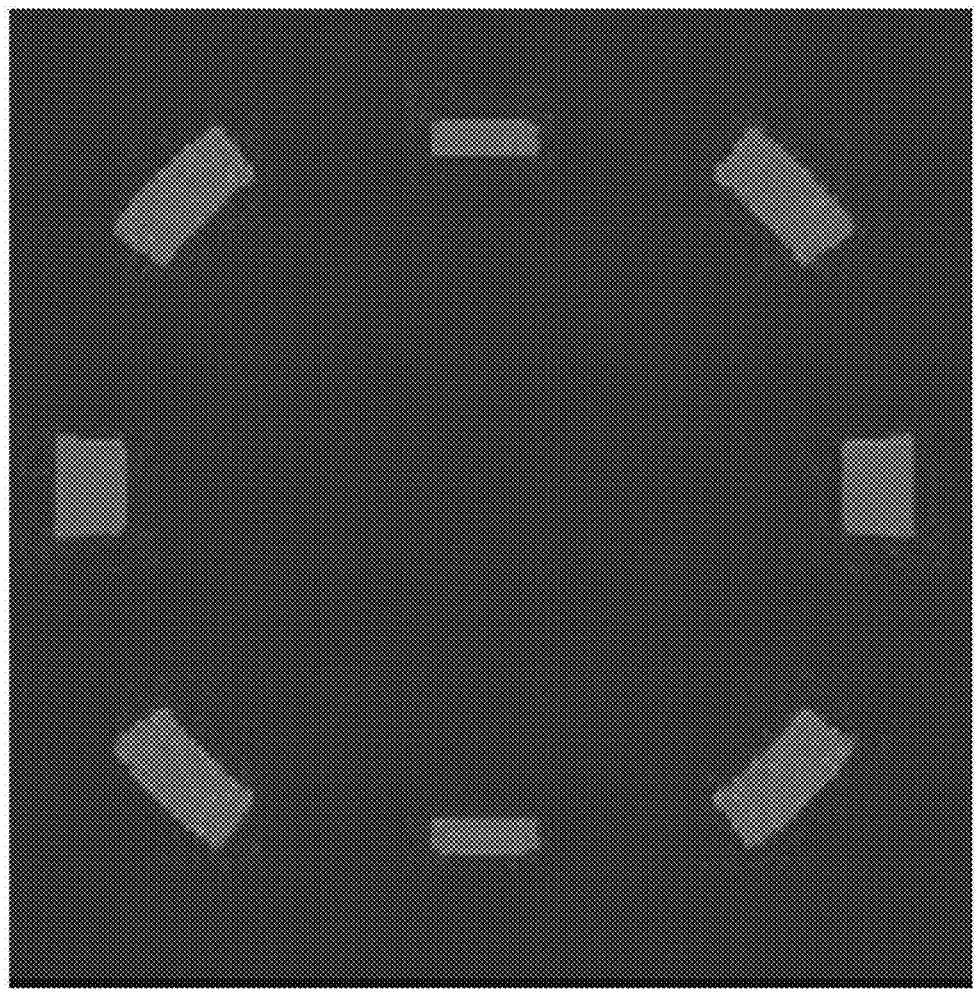
FIG. 8B another schematic view of the light sources to be optimized in the method for optimizing a light source in integrated circuit manufacturing according to a first embodiment of the present disclosure.

Referring to FIG. 8B, commonly, different users have different requirements for image resolution. The image in FIG. 8B has a higher resolution, with a coordinate point interval of 0.1.

Figure 9:
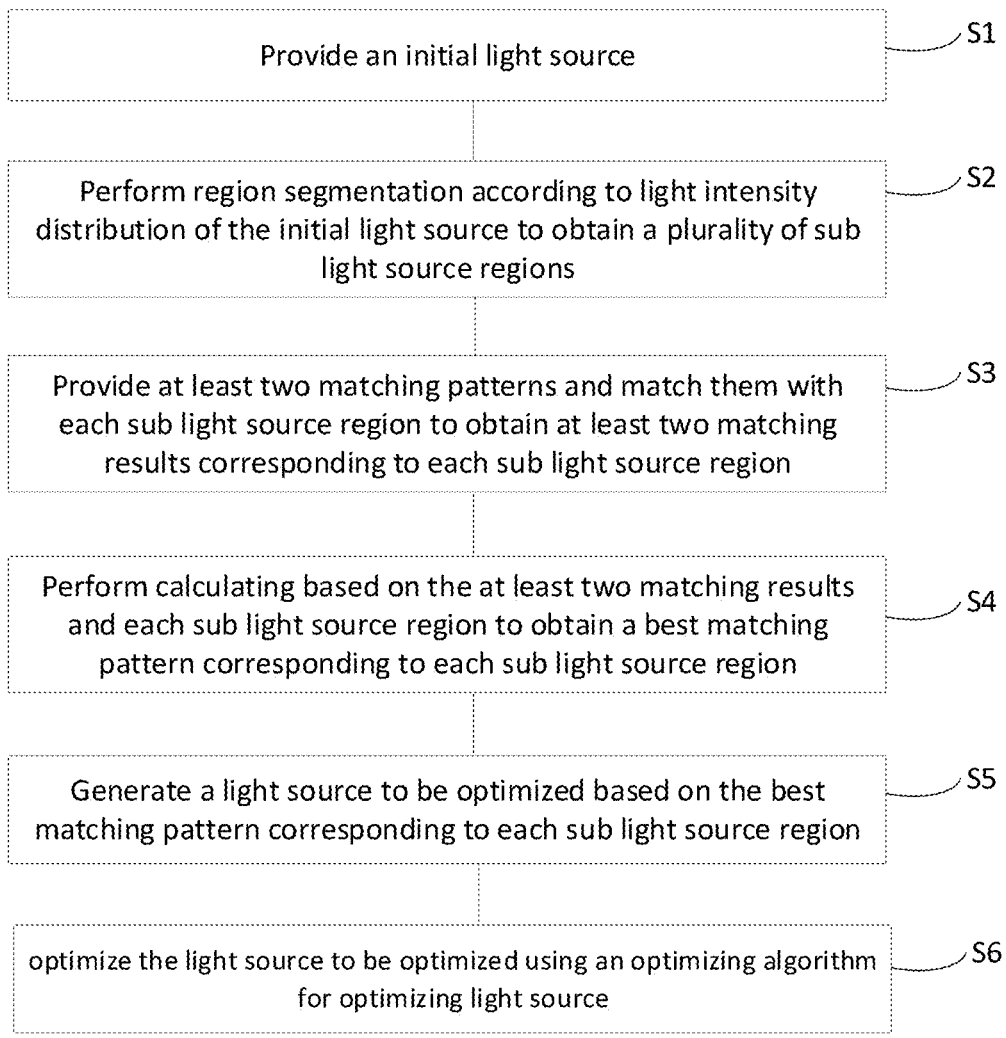
FIG. 9 is a flow chart of a method for optimizing a light source in integrated circuit manufacturing according to another variation of the first embodiment of the present disclosure.

Referring to FIG. 9, the method for optimizing light source in integrated circuit manufacturing further includes the following step:

S6, optimizing the light source to be optimized using an optimizing algorithm for optimizing light source. In this step, the optimizing algorithm for optimizing light source can be one of conventional optimizing algorithms for optimizing light source, including the light source mask optimization method based on genetic algorithm, the light source optimization algorithm based on particle swarm optimization, and the light source optimization method based on linear programming.

Figure 10:
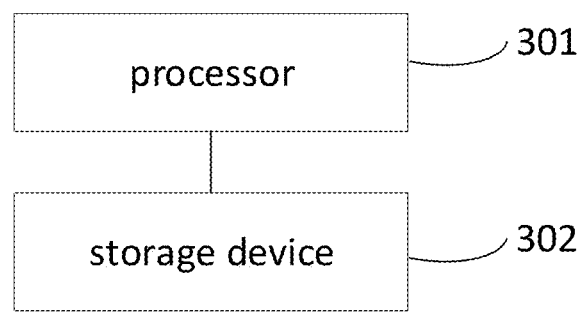
FIG. 10 is a block diagram of an electronic device according to a second embodiment of the present disclosure.

Referring to FIG. 10, a second embodiment of the present disclosure provides an electronic device 300, which includes one or more processors 301;

A storage device 302 configured to store one or more programs;

When the one or more programs are executed by the one or more processors 301, the one or more processors 301 are caused to perform the method for optimizing light source in integrated circuit manufacturing provided by the first embodiment or the method for optimizing light source in integrated circuit manufacturing provided by the variations of the first embodiment.

Figure 11:
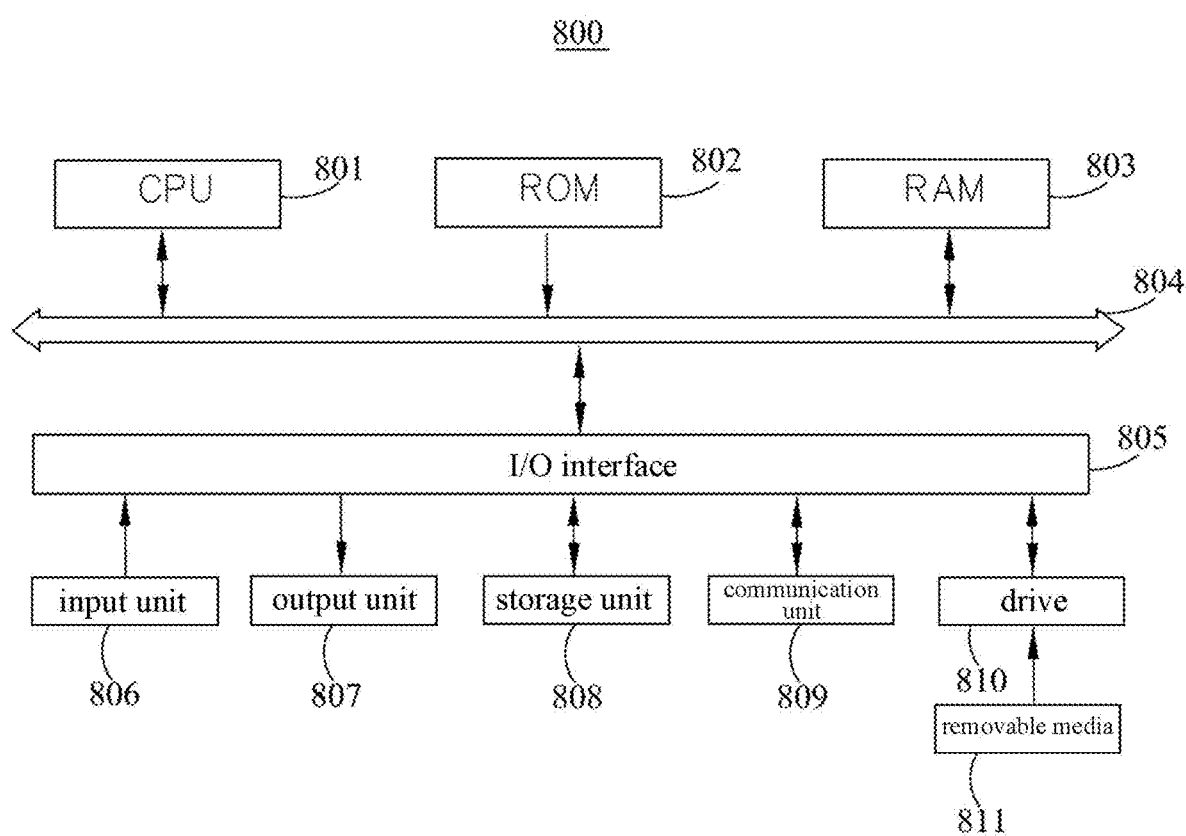
FIG. 11 is a schematic view of a computer system for implementing the present disclosure.

Referring to FIG. 11, a structural diagram of a computing system 800 for implementing a terminal device/server (e.g. the electronic device 300) is illustrated. The terminal device/server shown in FIG. 11 is only an example and should not impose any limitations on functionality and scope of use of the present disclosure.

Referring to FIG. 11, the computing system 800 includes a central processing unit (CPU) 801, which can perform various appropriate actions and processing based on programs stored in a read-only memory (ROM) 802 or programs loaded from a storage unit 808 into a random access memory (RAM) 803. In the RAM 803, various programs and data required for operations of the system 800 are also stored. The CPU 801, the ROM 802, and the RAM 803 are connected to each other through a bus 804. An input/output (I/O) interface 805 is also connected to the bus 804.

The following components are connected to the I/O interface 805: an input unit 806 including a keyboard, a mouse, and etc.; an output unit 807 including a cathode ray tube (CRT), a liquid crystal display (LCD), a speaker, and etc.; a storage unit 808 including a hard disk, and etc.; and a communication unit 809 including network interface cards such as LAN cards, modems, etc. The communication unit 809 performs communication processing through a network such as the Internet. A drive 810 is also connected to the I/O interface 805 as needed. A removable media 811, such as magnetic disks, optical disks, magneto-optical disks, semiconductor memory, etc., are installed on the drive 810 as needed to facilitate installation of computer programs read from it into the storage unit 808 as needed.

According to the embodiments of the present disclosure, the processes described in above methods may be implemented as a computer software program. For example, embodiments of the present disclosure include a computer program product that includes a computer program carried on a computer-readable medium. The computer program includes program codes for executing a method shown in a flow chart. In such an embodiment, the computer program may be downloaded and installed from the network through a communication unit 809, and/or installed from a removable medium 811. When the computer program is executed by the central processing unit (CPU) 801, the above functions defined in the methods of the present disclosure are executed. It should be noted that the computer-readable medium described in the present disclosure can be a computer-readable signal medium or a computer-readable storage medium or any combination of the two. Computer readable storage medium can include, but is not limited to, systems, devices or components including, but not limited to, electrical, magnetic, optical, electromagnetic, infrared, or semiconductor, or any combination of the above. More detailed examples of computer-readable storage medium may include, but are not limited to, an electrical connection with one or more wires, a portable computer disk, a hard disk, a random access memory (RAM), a read-only memory (ROM), an erasable programmable read-only memory (EPROM or flash memory), an optical fiber, a portable compact disk read-only memory (CD-ROM), an optical storage device, a magnetic storage device or any suitable combination of the above.

The computer program codes for performing the operations of the present disclosure can be written in one or more programming languages or a combination thereof. The programming languages include object-oriented programming languages such as Java, Smalltalk, C++, and conventional procedural programming languages such as "C" or similar programming languages. The program codes can be completely executed on a user's computer, partially executed on the user's computer, executed as an independent software package, partially executed on the user's computer, partially executed on a remote computer, or completely executed on the remote computer or a server. In the case involving a remote computer, the remote computer may be connected to the user computer through any kind of networks, including a local area network (LAN) or a wide area network (WAN), or may be connected to an external computer (e.g., through the Internet using an Internet service provider).

The flow charts and module diagrams in the attached drawings illustrate possible architectures, functions and operations of systems, methods and computer program products according to various embodiments of the present application. In this regard, each block in a flow chart or a block diagram may represent a module, program segment, or part of code that contains one or more executable instructions for implementing a specified logical function. It should also be noted that in some alternative embodiments, functions identified in the blocks may also occur in a different order than those shown in the drawings. For example, two blocks represented successively can actually be executed basically in parallel, and they can sometimes be executed in an opposite order, depending on functions involved. It should also be noted that each block in the block diagram and/or a flow chart and the combination of blocks in the block diagram and/or the flow chart can be realized by a dedicated hardware based system performing specified functions or operations, or by a combination of dedicated hardware and computer instructions.

The above computer readable medium stores one or more programs, when the one or more programs are executed by the device, the device is caused to perform the following steps: S1, provide an initial light source; S2, perform region segmentation according to light intensity distribution of the initial light source to obtain a plurality of sub light source regions; S3, provide at least two matching patterns and match them with each sub light source region to obtain at least two matching results corresponding to each sub light source region; S4, perform calculating based on the at least two matching results and each sub light source region to obtain a best matching pattern corresponding to each sub light source region; S5, generate light source to be optimized based on the best matching pattern corresponding to each sub light source region; S6, optimizing the light source to be optimized using an optimizing algorithm for optimizing light source.

The above description are only embodiments of the present disclosure, and is not intended to limit the present disclosure. Any modifications, equivalent substitutions, improvements, etc. made within the spirit and scope of the present disclosure are intended to be included within the scope of the present disclosure.

What is claimed is:

1. A method for optimizing a light source in integrated circuit manufacturing, comprising following steps:
    S1, providing an initial light source;
    S20, pixelating the initial light source, setting a light source intensity threshold, removing light source pixels below the light source intensity threshold and removing isolated light source pixels;
    S2, performing region segmentation according to light intensity distribution of the initial light source to obtain a plurality of sub light source regions;
    S3, providing at least two matching patterns and matching them with each sub light source region to obtain at least two matching results corresponding to each sub light source region;
    S4, performing calculating based on the at least two matching results and each sub light source region to obtain a best matching pattern corresponding to each sub light source region; and
    S5, generating a light source to be optimized based on the best matching pattern corresponding to each sub light source region.

2. The method for optimizing a light source in integrated circuit manufacturing according to claim 1, wherein, the method further comprises the following step:
    S6, optimizing the light source to be optimized using an optimizing algorithm for optimizing light source.

3. The method for optimizing a light source in integrated circuit manufacturing according to claim 1, wherein, in step S3, the at least two matching results comprise shape parameters corresponding to each matching pattern.

4. The method for optimizing a light source in integrated circuit manufacturing according to claim 1, wherein, step S4 comprises the following steps:

S41, generating a corresponding shape based on the shape parameters of each matching pattern and filling the corresponding shape with a light source intensity; and S42, performing calculation based on the shape parameters and the light source intensity in step S41 and the initial light source to obtain matching parameters, and determining a best matching pattern based on the matching parameters.

5. The method for optimizing a light source in integrated circuit manufacturing according to claim 4, wherein, in step S42, the performing calculation is based on normalization, and a formula for calculating the matching parameter $R_{ccoeff\_normed}$ is as follows:

$$R_{ccoeff\_normed} = \frac{\sum_{x',y'} T'(x',y') \cdot I'(x',y')}{\sqrt{\sum_{x',y'} T'(x',y')^2 \cdot \sum_{x',y'} I'(x',y')^2}}$$

wherein, T'(x', y') is light source intensity of the initial light source at a point (x',y'); I'(x', y') is light source intensity of a matching pattern corresponding to each matching result at the point (x', y').

6. The method for optimizing a light source in integrated circuit manufacturing according to claim 1, wherein, in step S5, the best matching pattern corresponding to each sub light source region is joined together in order to obtain the light source to be optimized.

7. The method for optimizing a light source in integrated circuit manufacturing according to claim 1, wherein, in step S3, the at least two matching patterns comprise regular polygons or irregular polygons, wherein the regular polygons comprise one or more shapes of a circle, a rectangle, and a sector, and the irregular polygons comprise one or more shapes of a leaf shape, a "zigzag" shape, and a "N" shape.

8. The method for optimizing a light source in integrated circuit manufacturing according to claim 1, wherein, in step S2, a rule for region segmentation is: grouping light source pixels with light source intensity values in 8 pixel positions around each pixel into a same group.

9. An electronic device, comprising:
    one or more processors;
    a storage device, configured to store one or more programs;
    when the one or more programs are executed by the one or more processors, the one or more processors are caused to perform the method for optimizing a light source in integrated circuit manufacturing of claim 1.

* * * * *